United States Patent [19]

Hsiung et al.

[11] Patent Number: 5,706,674
[45] Date of Patent: Jan. 13, 1998

[54] ARGON RECOVERY FROM SILICON CRYSTAL FURNACE

[75] Inventors: Thomas Hsiao-Ling Hsiung, Emmaus; Zbigniew Tadeusz Fidkowski, Macungie; Rakesh Agrawal, Emmaus, all of Pa.

[73] Assignee: Air Products and Chemicals, Inc., Allentown, Pa.

[21] Appl. No.: 785,515

[22] Filed: Jan. 17, 1997

Related U.S. Application Data

[60] Continuation-in-part of provisional application No. 60/012,439, Feb. 28, 1996.

[51] Int. Cl.⁶ ............................................. F25J 1/00
[52] U.S. Cl. ............................. 62/632; 62/636; 62/924
[58] Field of Search .......................... 62/636, 924, 632

[56] References Cited

U.S. PATENT DOCUMENTS

| | | | |
|---|---|---|---|
| 3,181,306 | 5/1965 | Greist et al. | 62/924 |
| 3,805,536 | 4/1974 | Lynn | 62/924 |
| 5,106,399 | 4/1992 | Fisher | 62/22 |
| 5,220,797 | 6/1993 | Krishnamurthy et al. | 62/924 |

FOREIGN PATENT DOCUMENTS

| | | | |
|---|---|---|---|
| 489387 | 3/1992 | Japan . | |
| 624962 | 4/1994 | Japan | C01B 23/00 |
| 733581 | 2/1995 | Japan | C30B 5/00 |

OTHER PUBLICATIONS

"Semiconductor Crystal Growth for the 90s and Beyond" by Peter Disessa, appearing in Semiconductor Fabtech, pp. 133–135.

"The Recovery and Recycling of High Purity Argon in the Semiconductor Industry" by J. V. O'Brien and J. V. Schurter, presented at the AIChE 1988 Spring National Meeting, Mar. 6–10, 1988.

*Primary Examiner*—Ronald C. Capossela
*Attorney, Agent, or Firm*—Geoffrey L. Chase

[57] ABSTRACT

The present invention is directed to two embodiments of a process for recycling an impure argon effluent from a silicon crystal growing furnace using cryogenics. The first embodiment uses cryogenic distillation techniques, and the second embodiment uses cryogenic adsorption, both of which use catalytic treatments and adsorption in conjunction with their cryogenic process steps to provide a pure argon recycle stream for a silicon crystal growth furnace.

15 Claims, 2 Drawing Sheets

ARGON RECOVERY FROM SILICON CRYSTAL FURNACE

CROSS-REFERENCE TO RELATED APPLICATIONS

This is a continuation-in-part of provisional patent application Ser. No. 60/012,439 filed Feb. 28, 1996.

BACKGROUND OF THE INVENTION

The present invention is directed to the field of recovering argon from the inerting atmosphere used in conjunction with growth of silicon crystals used in the semiconductor industry. More specifically, the present invention is directed to recovery, cleanup, purification and recycle of argon for inerting the environment from a silicon furnace where a silicon crystal is pulled for crystal growth and formation.

The semiconductor industry consumes large volumes of silicon crystals as the semiconductor substrate for use in producing various electronic media, including integrated circuits and memory devices. The end use requires very uniform silicon crystals with minimal impurities and aberrations in the crystal lattice.

The Czochralski process is the method of choice for high volume, reliable production of large diameter silicon monocrystal ingots. This process consists of freezing material from a molten pool onto the end of a single crystal seed of the same material. The material that becomes frozen replicates the single crystal structure of the seed. The result is a small seed eventually becomes a large crystal. The process is fundamentally quite simple and is thermodynamic in nature. A solid-liquid interface is formed by maintaining a temperature gradient that must be precisely controlled along with the seed pull rate. In order to maintain the heat flux along the solid-liquid interface, the molten silicon contained in the quartz crucible must be raised within the furnace hot zone as liquid is displaced from the equilibrium point and the crystal is formed. The raising process helps to maintain precise control over the temperature distribution in three dimensions, and therefore both seed lift and crucible lift precise control mechanisms are required. The seed and crucible are continuously rotated during the process to improve temperature uniformity, as well as to maintain uniform dopants distribution in both the axial and radial directions. In order to achieve production-worthy silicon crystals, the process requires the complex interaction and control of various process parameters.

These silicon ingots are grown in a process atmosphere typically comprising high purity argon in order to avoid deposition or incorporation of impurities into the evolving silicon crystal lattice. These impurities may exist in the silicon bath, the degradation of the quart crucible or in atmospheres that are present in the absence of the argon purge gas.

Because the utilization of argon is large and the availability of argon on the commercial market is modest, various attempts to reutilize the argon have been identified in the prior art, and each of these attempts has tried to overcome the problem of taking the contaminated, impure argon effluent from the silicon crystal furnace and treating it to remove particulates, dopants and other contaminating impurities in the form of gases for recycle of acceptably pure argon for reutilization in the silicon crystal furnace. A key criteria is the recovery and purification of such argon in a technically feasible, yet economically viable, process so as to be competitive with the commercial costs of fresh argon from the industrial gas market.

A typical silicon crystal furnace and the operation of growing silicon crystals is identified in the article, "Semiconductor Crystal Growth for the 90s and Beyond" by Peter Disessa, appearing in Semiconductor Fabtech, pp. 133–135.

Japanese Public Patent Disclosure Number 4-89387 discloses a process for inert gas recovery for single crystal pullers comprising the recovery of argon from a single crystal silicon furnace by a vacuum pump with the removal of particulates. The compressed impure argon is passed through a zeolite-packed pressure swing adsorption bed to remove nitrogen, carbon monoxide and carbon dioxide before being passed to a palladium catalyst bed, a deoxo unit and an adsorption tower to remove hydrogen, oxygen, carbon monoxide, water and carbon dioxide. The purified argon is then returned to the furnace for further duty in inerting the silicon crystal growth process.

Japanese Public Patent Disclosure Number 7-33581 discloses an argon purification and recycle process for silicon crystal furnaces in which impurities such as carbon monoxide, oxygen and hydrogen are converted in a catalyst bed to result in carbon dioxide and water, which are removed in an adsorptive section of a purification device. The impure argon is recovered from the silicon furnace with a dry vacuum pump and particulate silicon dioxide is captured in a bubble column apparatus.

Japanese Public Patent Disclosure Number 6-24962 discloses a method of recovering highly pure argon from the exhaust gases of a silicon crystal manufacturing furnace. The process involves removing the impure argon from a silicon crystal furnace and retaining it in a storage vessel. The impure argon is passed through a venturi to remove particulates and then is compressed before having oil from compression contamination removed and passing the impure argon through a deoxo catalyst tube to remove oxygen by the addition of hydrogen over the catalyst. The oxygen-depleted impure argon is then passed through catalyst beds of cupric oxide to remove hydrogen and carbon monoxide and convert them to carbon dioxide and water. The cupric oxide catalyst beds are provided in tandem for switching mode of on-line and regeneration. The moist and carbon dioxide containing impure argon is then passed through switching beds of an appropriate zeolite to remove water and carbon dioxide. Nitrogen is then removed from the argon in an additional set of tandem switching adsorptive beds of a zeolite. The nitrogen adsorption is conducted on the zeolite beds at −50° C. The zeolite may be a mordenite adsorbent. The argon is then ready for recycle for utilization.

U.S. Pat. No. 5,106,399 discloses an argon purification system. The impure argon is passed through a bed of molecular sieve adsorbent to adsorb water and carbon dioxide. The dehydrated impure argon is then passed through a catalytic material to chemasorb oxygen, hydrogen and carbon monoxide. Finally, the argon is passed through an adsorbent bed at cryogenic temperatures to adsorb nitrogen and hydrocarbons before recovering a purified argon stream for reutilization. Argon recovery and recycle has also been described in an article, "The Recovery and Recycling of High Purity Argon in the Semiconductor Industry" by J. V. O'Brien and J. V. Schurter, presented at the AIChE 1988 Spring National Meeting, Mar. 6–10, 1988. The article describes the recycling of contaminated argon from a silicon crystal growth furnace using compression, catalytic reaction of carbon monoxide and methane with oxygen, catalytic reaction of excess oxygen with hydrogen in a deoxo process, the removal of carbon dioxide and water on molecular sieve beds, and the cryogenic distillation of the argon to remove hydrogen and nitrogen prior to recycling the argon for reutilization in the silicon crystal-growing furnace.

The prior art has attempted to resolve the high consumption rate of argon in the growth of silicon crystals for the semiconductor industry. However, the prior art processes for argon recovery and purification to reutilize argon in silicon crystal furnaces has suffered from undue complication and inefficiency resulting in costly processing and expensive apparatus. Furthermore, the prior art has no methods to remove volatile dopants that could be present in the impure argon. The present invention as described below overcomes these problems in the prior art argon recycling field to provide an efficient and inexpensive mode of argon recovery and purification for utilization in silicon crystal growth furnaces.

BRIEF SUMMARY OF THE INVENTION

The present invention utilizes cryogenic distillation or cryogenic adsorption in two separate process embodiments for the recovery, purification and recycle of argon to a silicon crystal growth furnace. The first embodiment utilizing cryogenic distillation recovers impure argon and compresses it before sending it to a scrubber to remove contaminating dopants by absorption using solvents or liquid agents. The argon is then passed through a deoxo unit with the addition of hydrogen, if needed, to convert oxygen content in the impure argon on an appropriate deoxo catalyst bed. The deoxygenated argon is then passed through switching temperature swing adsorption beds to remove carbon dioxide and water before being sent to a double-column distillation column to recover pure argon by rectification. In the high pressure or lower distillation zone, argon is separated from nitrogen, hydrogen or carbon monoxide. In the low pressure or upper distillation zone, pure argon is recovered from residual hydrocarbons. The liquid argon makeup, in addition to the recycled argon, is admitted as a midpoint stream in the low pressure, upper distillation column for rectification and purification. The pure argon is then heat exchanged against the incoming impure argon and sent to further use as a pure argon stream in the silicon crystal furnace.

In a second embodiment, impure argon is removed from the silicon crystal growth furnace and is compressed and cooled before being subjected to a wet scrubber using various caustic agents, liquid scrubbers or solvents to remove contaminating dopants contained in the impure argon. Any solid particles present are also removed in the wet scrubber. The argon is then subjected to a deoxo process to remove oxygen with the addition of hydrogen, if needed, over a catalyst bed containing typical deoxo catalyst before the impure deoxygenated argon is then passed through switching cupric oxide catalyst beds to convert carbon monoxide and hydrogen to water and carbon dioxide. The impure argon containing water and carbon dioxide is then passed through switching zeolitic beds to remove the water and carbon dioxide by adsorption. Finally, the dry argon is then passed through calcium X-zeolite switching beds at cryogenic temperature conditions, along with any makeup argon, to remove nitrogen and methane before being heat exchanged against incoming impure argon and recycled for utilization in the silicon crystal growing furnace.

DETAILED DESCRIPTION OF THE INVENTION

The present invention for the recovery of impure argon from a silicon crystal growth furnace for purification and recycle will now be described in greater detail with regard to the two embodiments, one, cryogenic distillation and the other, cryogenic adsorption, with reference to the drawings.

Figure 1:
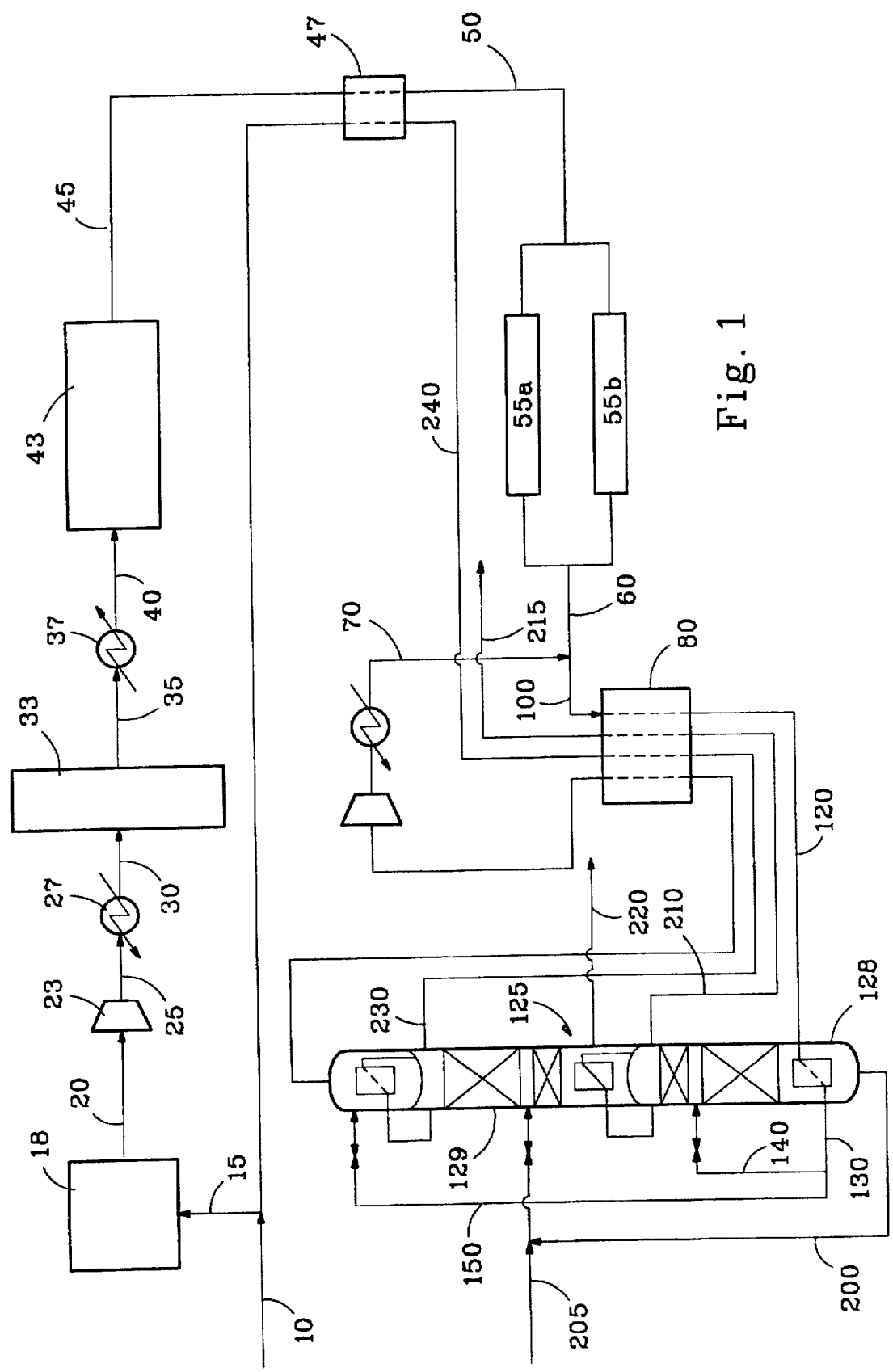
FIG. 1 is a schematic illustration of the first embodiment of the present invention using cryogenic distillation to recover, purify and recycle argon to a silicon crystal growth furnace.

With reference to FIG. 1, the embodiment of the present invention directed to argon recovery, purification and recycle using cryogenic distillation will now be described.

An impure argon effluent gas 20 is removed from a furnace 18 where silicon crystals are grown using, for instance, the Czochralski process. The stream 20 has impurities of nitrogen, oxygen, water, hydrogen, carbon dioxide, carbon monoxide, hydrocarbons and various dopants and particulates. The impure argon is compressed to a pressure of 140 psia in a compressor 23 as stream 25 before being aftercooled in heat exchanger 27 to 90° F. and passed as stream 30 through a liquid scrubber 33 which uses various caustic solutions, solvents or liquid scrubbing agents, such as aqueous sodium or potassium hydroxide, to remove dopants, such as oxides and hydrides of arsenic, phosphorus, antimony, gallium and boron, and particulates, such as silicon dioxide, from the impure argon. The impure argon 35 is then heated in a heat exchanger 37 to approximately 350° F. in stream 40 before being introduced into a deoxo catalyst unit 43 where hydrogen reacts with oxygen contained in the impure argon over a catalyst bed to eliminate oxygen in the impure argon as it is removed in line 45. The deoxo catalyst may be any commercially available deoxo catalyst such as various forms of palladium, platinum/palladium mixtures. The deoxygenated, impure argon in line 45 heat exchanges against rewarming cold pure argon in a heat exchanger 47 to return to a temperature in stream 50 of 90° F. The stream can be further cooled in a chiller heat exchanger before being passed through switching zeolite adsorptive beds 55a and 55b operated on a temperature swing adsorption process to remove carbon dioxide and water from the impure argon. The zeolite can be any zeolite which is selective to adsorb water and carbon dioxide, such as 13X-zeolite, 4A-zeolite, 5A-zeolite and mixtures thereof. Stream 60 has no oxygen, water or carbon dioxide. This stream is then mixed with argon 70 from a downstream cryogenic distillation column, and the combined stream in line 100 is heat exchanged in heat exchanger 80 against various process streams coming from the cryogenic distillation column before being introduced as stream 120 as the reboil stream for the high pressure or lower column 128 of a dual column distillation column 125. After reboil duty, the impure argon in line 130 is split into a feed 140 to the high pressure or base column 128 and a reflux in stream 150 for condensing vapor in the low pressure or upper distillation column 129 of the dual distillation column 125. In the base or high pressure distillation column 128, nitrogen, hydrogen and/or carbon monoxide is separated from a partially purified argon, wherein the argon containing some hydrocarbons, such as 200 ppm of methane, is removed as a stream in line 200 to be mixed with makeup liquid argon 205, while carbon monoxide is removed in line 210 for rewarming against incoming, impure argon in a heat exchanger 80 before being removed in line 215. The makeup liquid argon and the partially purified argon in stream 200 are introduced into the low pressure or upper distillation column 129 of the dual distillation column 125 where they are rectified for further purification by being reboiled against the overhead of the high pressure column and refluxed by the cold, impure argon in stream line 150. The liquid in the sump of the low pressure distillation column 129 generates reflux for the high pressure column 128 by indirect heat exchange. The purified argon in line 230 is removed, rewarmed against incoming impure argon in heat exchanger 80 and 47 and recycled in line 240 and stream 15. Makeup argon 10 can be added to argon 15. The argon in line 230 is at a temperature of approximately −261° F. Its pressure is 97 psia. A waste stream of hydrocarbons are removed as the liquid from the base of the low pressure upper distillation column 129 in line 220.

Figure 2:
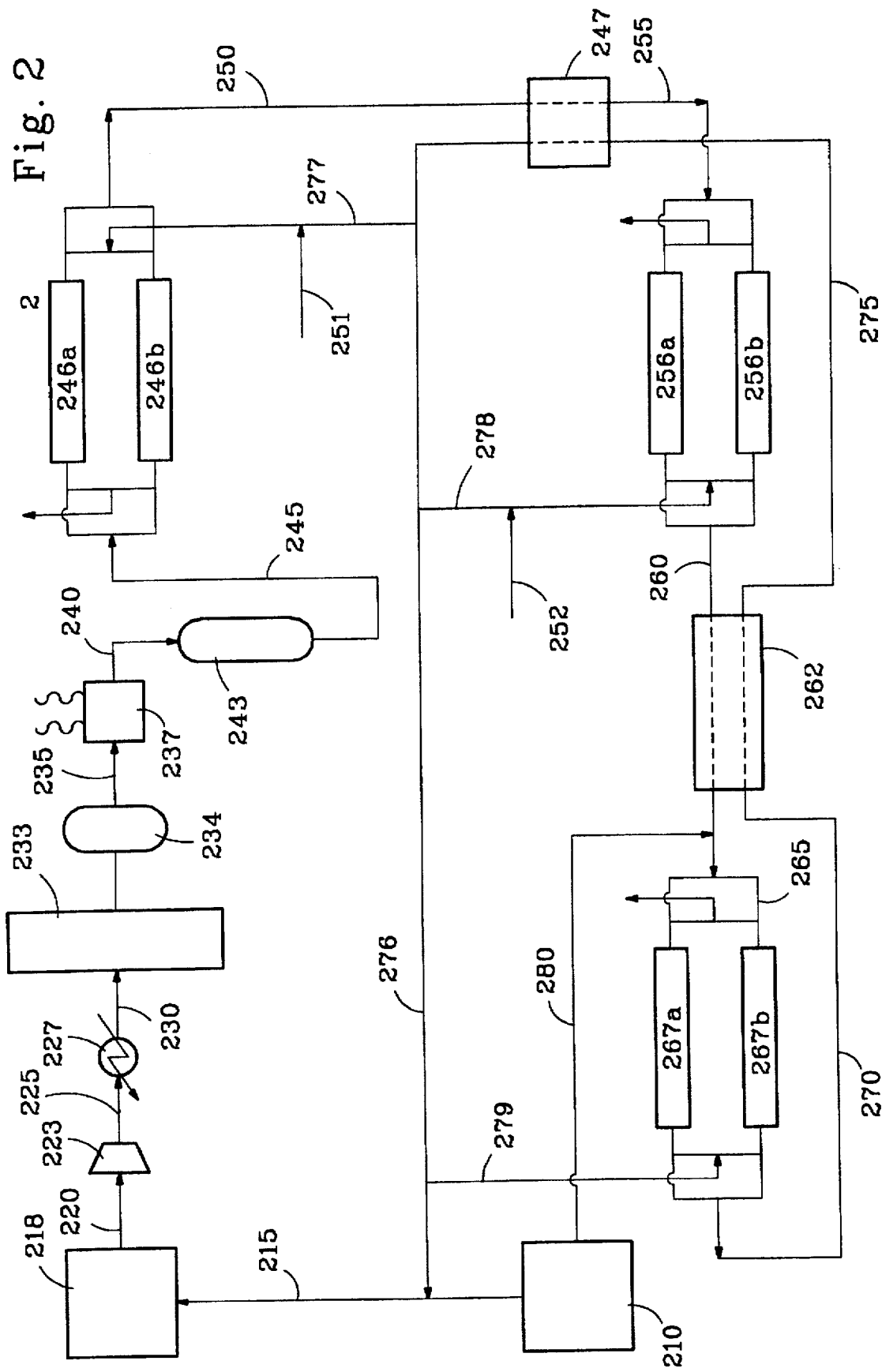
FIG. 2 is a schematic illustration of a process to recover, purify and recycle argon using cryogenic adsorption for a silicon crystal growing furnace.

The present invention can also use cryogenic technology to purify an argon effluent stream from a silicon crystal growing furnace using adsorptive techniques rather than the cryogenic rectification and distillation of the first embodiment. The second embodiment will be described with reference to FIG. 2. An impure argon effluent stream in line 220 is removed from a silicon crystal growing furnace 218 wherein the impure argon stream contains nitrogen, oxygen, water, hydrogen, carbon dioxide, carbon monoxide, hydrocarbons and potentially dopants, such as oxides and hydrides of arsenic, phosphorus, antimony, gallium and boron, and various particulates, such as silicon dioxide. The stream is compressed to a pressure of approximately 110 psia through a compressor 223 and is removed in line 225 for aftercooling through a heat exchanger 227 to result in a stream in line 230 at 90° F. and 108 psia. This stream is introduced into a wet scrubber 233 using caustic agents, solvents or liquid absorbents, such as aqueous sodium or potassium hydroxide, to remove contained dopants and particulates as recited above for the first embodiment. The scrubbed, impure argon is collected in the surge tank 234 and passed as stream 235 to be heated in a heat exchanger 237 from a temperature of 90° F. in stream 35 to 350° F. in line 240 before being passed to a deoxo unit 243 to remove contained oxygen over a catalyst in the presence of hydrogen. The deoxo catalyst may be any commercially available deoxo catalyst such as various forms of palladium, platinum/palladium mixtures, various forms of nickel and mixtures thereof. The deoxygenated impure argon in line 245 is then introduced into one of a tandem pair of switching cupric oxide catalyst beds 246a and 246b which convert carbon monoxide and hydrogen to water and carbon dioxide in the impure argon stream. The off-line cupric oxide bed can be regenerated using a mixture of oxygen and nitrogen in line 251, and finally purged with a slipstream of the product argon in line 277. The water and carbon dioxide containing impure argon in line 250 is then cooled against purified argon from downstream in a heat exchanger 247 and is at a temperature of 80° F. in line 255 before being introduced into one of a tandem pair of switching zeolite adsorbent beds 256a and 256b that remove water and carbon dioxide from the impure argon. The zeolite can be any zeolite which is selective to adsorb water and carbon dioxide, such as 13X-zeolite, 4A-zeolite, 5A-zeolite and mixtures thereof. The off-line bed can be regenerated using a nitrogen purge gas 252 and finally purged by a slipstream of product argon in line 278. The dried and carbon dioxide depleted impure argon in line 60 still contains nitrogen and methane at a temperature of 80° F. and pressure of 99 psia. The stream in line 60 is further cooled by heat exchange in heat exchanger 262 against the purified argon stream 270 to cool the impure argon to a temperature of −220° F. before being passed with makeup argon 280 in stream 265 through one of a tandem pair of switching calcium X-zeolite beds 267a and 267b to remove nitrogen and methane by cryogenic adsorption. The off-line calcium X-zeolite bed may be regenerated using a slip stream 279 of the purified argon and by warming to ambient temperature. The purified argon from the calcium X-zeolite beds 267a and 267b which is now depleted of nitrogen and methane contained therein is removed in line 270 at a temperature of −220° F. and a pressure of 97 psia and is rewarmed against impure argon in line 260 and, further, warmed in line 275 against impure argon in line 250 to a temperature of 70° F. and a pressure of 95 psia before being recycled 276 with argon makeup 210 for reintroduction into the silicon crystal growing furnace in line 215. Alternatively, the makeup argon in line 280 at −250° F. and 98 psia may be passed through the nitrogen and methane removal calcium X-zeolite beds 267a and 267b with the recycling impure argon before being sent to the crystal growing furnace 218.

Having described the two embodiments of cryogenic argon purification for silicon crystal growth in furnaces, it is readily apparent that the present invention uses cryogenic conditions to uniquely purify argon, either by distillation or adsorption, in a simplified manner and in a unique series of process steps which allow for the most appropriate removal of contaminants from the argon in order to minimize volumetric flows of gas through catalytic, adsorptive and distillation process stations, while providing for ready regeneration of those process stations requiring such regeneration with a minimal of capital investment in equipment, while providing for low cost operation and high purity argon recycle.

We claim:

1. A process for the recovery and purification of impure argon containing residual dopants from a silicon crystal growth furnace using the steps of:
   (1) contacting the impure argon with a deoxygenation catalyst and hydrogen to remove any contained oxygen;
   (2) contacting the impure argon with a zeolitic adsorbent selective to the adsorption of water and carbon dioxide from the impure argon to remove any water and carbon dioxide from the impure argon;
   (3) further purifying the impure argon in a cryogenic temperature separation to remove remaining impurities from the impure argon and produce an argon product stream having a purity of at least 99.5% by volume;

the improvement comprising removing dopants from the impure argon prior to step (1) by contact of the impure argon with a liquid absorbent to strip the dopants from the impure argon.

2. The process of claim 1 wherein the cryogenic temperature separation is a cryogenic dual column distillation separation with a high pressure distillation column separation of nitrogen and carbon monoxide from the impure argon and a low pressure distillation column separation of hydrocarbons from the impure argon.

3. The process of claim 2 wherein the cryogenic temperature is no greater than −260° F.

4. The process of claim 1 wherein the impure argon after contact with the deoxygenation catalyst is contacted with a cupric oxide catalyst to convert carbon monoxide and hydrogen to water and carbon dioxide.

5. The process of claim 4 wherein the cupric oxide catalyst is contained in two parallel switching adsorbent beds with one bed contacting the impure argon while the other bed is being regenerated with an oxygen containing inert gas and portion of the argon product stream.

6. The process of claim 4 wherein the cryogenic temperature separation is a cryogenic selective adsorption of nitrogen and hydrocarbons from the impure argon on a calcium X-zeolite adsorbent.

7. The process of claim 6 wherein the cryogenic temperature is no greater than −220° F.

8. The process of claim 1 wherein the argon product stream is recycled to the silicon crystal growth furnace.

9. The process of claim 1 wherein the liquid absorbent is selected from the group consisting of sodium hydroxide, potassium hydroxide and mixtures thereof.

10. The process of claim 1 wherein the cryogenic temperature is no greater than −200° F.

11. A process for the recovery and purification of impure argon containing residual dopants from a silicon crystal growth furnace using the steps of:
   (1) contacting the impure argon with a deoxygenation catalyst and hydrogen to remove any contained oxygen;
   (2) contacting the impure argon with a zeolitic adsorbent selective to the adsorption of water and carbon dioxide from the impure argon to remove any water and carbon dioxide from the impure argon;
   (3) introducing the impure argon into a cryogenic distillation column to separate nitrogen from the impure argon to produce an argon product stream having a purity of at least 99.5% by volume; and
   (4) recycling the argon product stream to the silicon crystal growth furnace;

the improvement comprising removing the dopants from the impure argon prior to step (1) and performing step (3) in a cryogenic dual column distillation separation with a high pressure distillation column separation of nitrogen, hydrogen and carbon monoxide from the impure argon and a low pressure distillation column separation of hydrocarbons from the impure argon.

12. The process of claim 11 wherein the zeolite adsorbent is contained in two parallel switching adsorbent beds with one bed contacting the impure argon while the other bed is being regenerated by elevated temperature.

13. A process for the recovery and purification of impure argon containing residual dopants from a silicon crystal growth furnace using the steps of:
   (1) contacting the impure argon with a deoxygenation catalyst and hydrogen to remove any contained oxygen;
   (2) contacting the impure argon with a cupric oxide catalyst to convert carbon monoxide and hydrogen to water and carbon dioxide;
   (3) contacting the impure argon with a zeolitic adsorbent selective to the adsorption of water and carbon dioxide from the impure argon to remove any water and carbon dioxide from the impure argon;
   (4) contacting the impure argon at a cryogenic temperature with calcium X-zeolite adsorbent to remove nitrogen and hydrocarbons from the impure argon and produce an argon product stream having a purity of at least 99.5% by volume; and
   (5) recycling the argon product stream to the silicon crystal growth furnace;

the improvement comprising removing the dopants from the impure argon prior to step (1) by contact of the impure argon with aqueous sodium hydroxide to strip the dopants from the impure argon.

14. The process of claim 13 wherein the calcium X-zeolite adsorbent is contained in two parallel switching adsorbent beds with one bed contacting the impure argon while the other bed is being regenerated with a portion of the argon product stream.

15. The process of claim 13 wherein the zeolite adsorbent is contained in two parallel switching adsorbent beds with one bed contacting the impure argon while the other bed is being regenerated initially with nitrogen gas and then by a portion of the argon product stream.

* * * * *